(12) United States Patent
Kim et al.

(10) Patent No.: US 10,482,962 B2
(45) Date of Patent: Nov. 19, 2019

(54) TCAM DEVICE AND OPERATING METHOD THEREOF

(71) Applicants: Samsung Electronics Co., Ltd., Suwon-si (KR); Research & Business Foundation SUNGKYUNKWAN UNIVERSITY, Suwon-si (KR)

(72) Inventors: Cheol Kim, Seoul (KR); Hyun-Suk Kang, Suwon-si (KR); Kee-Won Kwon, Suwon-si (KR); Rak-Joo Sung, Suwon-si (KR); Sung-Gi Ahn, Suwon-si (KR)

(73) Assignees: SAMSUNG ELECTRONICS CO., LTD., Samsung-ro, Yeongtong-gu, Suwon-si, Gyeonggi-do (KR); Research & Business Foundation, Sungkyunkwan Univ., Jangan-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/979,669

(22) Filed: May 15, 2018

(65) Prior Publication Data

US 2019/0080762 A1 Mar. 14, 2019

(30) Foreign Application Priority Data

Sep. 11, 2017 (KR) .......................... 10-2017-0116124

(51) Int. Cl.
*G11C 15/04* (2006.01)
*G11C 15/00* (2006.01)
*G11C 13/00* (2006.01)

(52) U.S. Cl.
CPC ........ *G11C 15/046* (2013.01); *G11C 13/0004* (2013.01); *G11C 13/0009* (2013.01); *G11C 15/00* (2013.01); *G11C 15/04* (2013.01)

(58) Field of Classification Search
CPC ....... G11C 15/00; G11C 15/04; G11C 15/046; G11C 13/0004; G11C 14/0009
See application file for complete search history.

(56) References Cited

U.S. PATENT DOCUMENTS

| | | | | |
|---|---|---|---|---|
| 6,999,331 B2 * | 2/2006 | Huang | ................... | G11C 15/04 365/207 |
| 7,064,971 B2 * | 6/2006 | Shau | ...................... | G11C 15/04 365/195 |
| 7,227,765 B2 * | 6/2007 | De Sandre | ......... | G11C 13/0004 365/189.07 |

(Continued)

FOREIGN PATENT DOCUMENTS

JP 5907524 B2 4/2016

*Primary Examiner* — Vanthu T Nguyen
(74) *Attorney, Agent, or Firm* — Muir Patent Law, PLLC

(57) ABSTRACT

A ternary content addressable memory (TCAM) device includes a memory cell. The memory cell includes a data storage circuit, a limiter circuit, and a discharge circuit. The data storage circuit includes a first resistor and a second resistor connected in series to divide a voltage corresponding to search data, and configured to store cell data. The limiter circuit is configured to receive the divided voltage through an input terminal and transmit an output voltage through an output terminal based on a level of the divided voltage. The discharge circuit discharges a matching line indicating whether the stored cell data matches with the search data, based on the output voltage of the limiter circuit.

20 Claims, 9 Drawing Sheets

(56) References Cited

U.S. PATENT DOCUMENTS

| | | |
|---|---|---|
| 7,474,546 B2 * | 1/2009 | Shastry .................. G11C 15/04 365/203 |
| 9,230,649 B2 | 1/2016 | Chang et al. |
| 9,281,023 B2 * | 3/2016 | Arsovski .................. G11C 7/08 |
| 9,502,114 B1 | 11/2016 | Lin et al. |
| 9,543,013 B1 | 1/2017 | Govindaraj et al. |
| 9,589,636 B1 | 3/2017 | Bhavnagarwala et al. |
| 2015/0248936 A1 | 9/2015 | Best et al. |

* cited by examiner

| Stored data | R1/R2 | Search data = "0" DL[0] = Vdl_l DLB[0] = Vdl_h | | Search data = "1" DL[0] = Vdl_h DLB[0] = Vdl_l | |
|---|---|---|---|---|---|
| | | Vlv | ML0 | Vlv | ML0 |
| 0 | LRS/HRS | VSSL | VDD | Vdiv_mm | VSS |
| 1 | HRS/LRS | Vdiv_mm | VSS | VSSL | VDD |
| DC | HRS/HRS | VSSL | VDD | VSSL | VDD |

TCAM DEVICE AND OPERATING METHOD THEREOF

CROSS-REFERENCE TO RELATED APPLICATIONS

This U.S. non-provisional patent application claims priority under 35 U.S.C. § 119 to Korean Patent Application No. 10-2017-0116124, filed on Sep. 11, 2017, in Korean Intellectual Property Office, the entire contents of which are incorporated herein by reference.

BACKGROUND

Embodiments of the present disclosure relate to a content-addressable memory (CAM), and more particularly, relate to a ternary CAM (TCAM) device and an operating method thereof.

CAM devices may support a read operation, a write operation, and a search operation for data. In the search operation, comparison of search data with entries of data stored in the CAM device may be performed in parallel. For example, during one clock cycle, the search data may be compared with entries of all data stored in the CAM device. When bits of a data entry are respectively matched with bits of the search data, an address of the data entry is output. Here, data of logic "0" or logic "1" may be stored in a data entry of the CAM device.

The TCAM device performs a function similar to the CAM device. However, as well as logic "0" and logic "1", a "don't care" bit (hereinafter referred to as a "DC bit") may be further stored in the data entry of the TCAM device. A memory cell in which the "DC" bit is stored is not compared with search data. That is, regardless of the search data, a memory cell in which the "DC" bit is stored always outputs a matching result.

TCAM devices may be implemented using resistive memory elements. A low resistance ratio between resistive memory elements is required to implement the TCAM devices with a high-speed and low-power characteristic. However, due to the low resistance ratio, it is difficult to secure a sufficient difference (a voltage margin or a sensing margin) between a matching line voltage for matching and a matching line voltage for mismatching.

SUMMARY

Embodiments of the present disclosure provide a TCAM device including resistive memory elements and an operating method thereof.

According to an aspect of an embodiment, a ternary content addressable memory (TCAM) device may include a memory cell. The memory cell may include a data storage circuit, a limiter circuit, and a discharge circuit. The data storage circuit may include a first resistor and a second resistor connected in series to divide a voltage corresponding to search data, and configured to store cell data. The limiter circuit may receive the divided voltage through an input terminal and transmit an output voltage through an output terminal based on a level of the divided voltage. The discharge circuit may discharge a matching line indicating whether the stored cell data matches with the search data, based on the output voltage of the limiter circuit.

According to another aspect of an embodiment, a ternary content addressable memory (TCAM) device may include a driver, a memory cell, and a matching line. The driver may provide a search voltage corresponding to search data to a data line. The memory cell may include a first resistor and a second resistor for the purpose of storing cell data, the search voltage provided through the data line may be divided by the first resistor and the second resistor, and the memory cell may determine whether the search data matches with the stored cell data, based on the divided voltage. The matching line may be discharged according to whether the search data matches with the stored cell data.

According to another aspect of an embodiment, a method for a search operation of a ternary content addressable memory (TCAM) including a memory cell may include providing a search voltage corresponding to search data to the memory cell, dividing the search voltage, by a first resistor and a second resistor connected in series in the memory cell, transmitting the divided voltage to a discharge circuit in the memory cell based on a level of the divided voltage, by a limiter circuit in the memory cell, and discharging a matching line based on the divided voltage, by the discharge circuit.

DETAILED DESCRIPTION

Below, embodiments of the present disclosure may be described in detail and clearly to such an extent that an ordinary one in the art easily implements the inventive concept.

Figure 1:
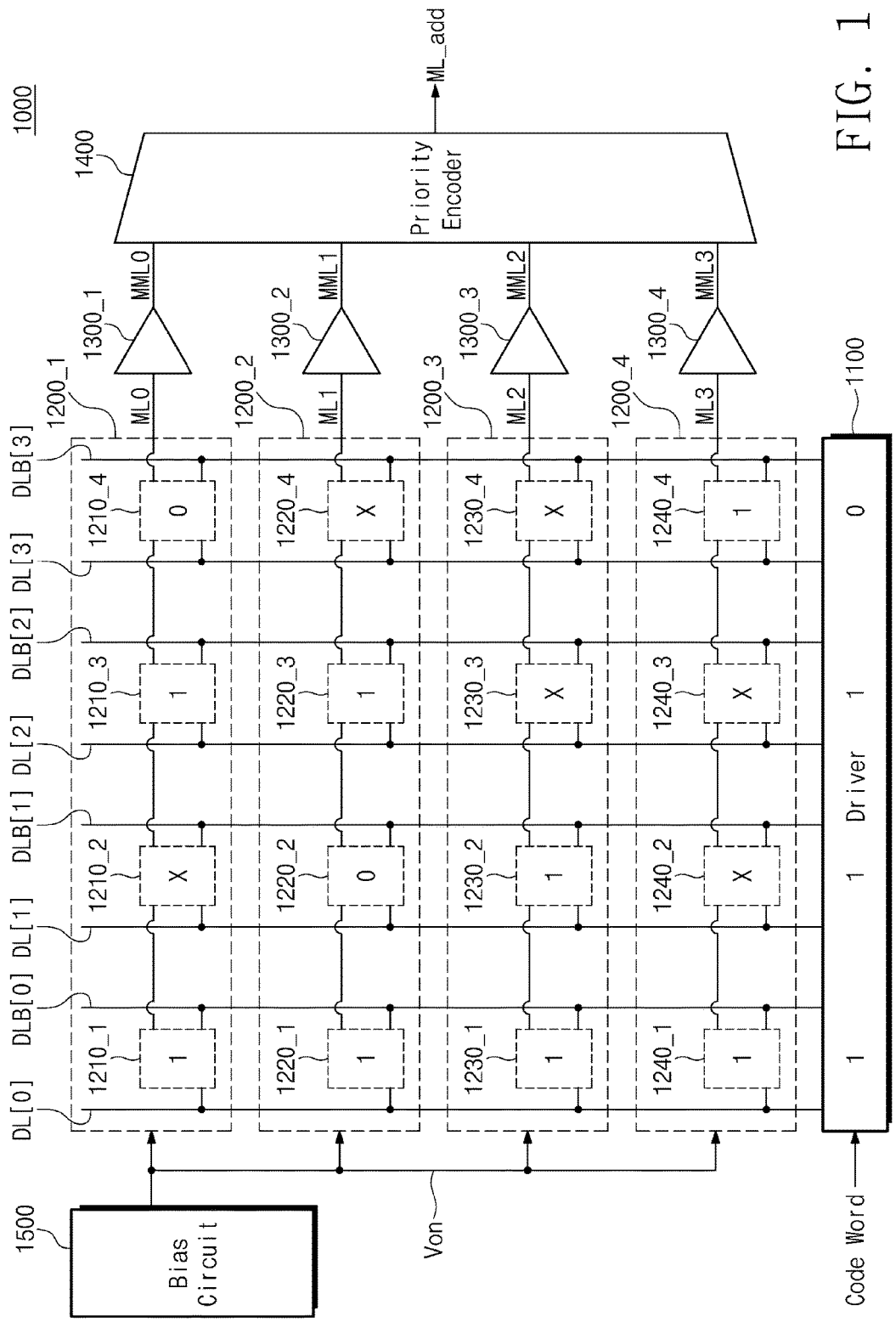
FIG. 1 is a block diagram illustrating a ternary content addressable memory (TCAM) according to an embodiment of the inventive concept.

FIG. 1 is a block diagram illustrating a TCAM according to an embodiment of the inventive concept. Referring to FIG. 1, a TCAM device 1000 may include a driver 1100, first to fourth memory cell arrays 1200_1 to 1200_4, first to fourth match amplifiers 1300_1 to 1300_4, a priority encoder 1400, and a bias circuit 1500. In FIG. 1, the number of memory cell arrays 1200_1 to 1200_4 and the number of match amplifiers 1300_1 to 1300_4 are only an example, and the inventive concept is not limited thereto.

The driver 1100 provides a code word to the first to fourth memory cell arrays 1200_1 to 1200_4 through first to fourth data line pairs DL[0:3] and DLB [0:3]. The code word is data to be searched among data stored in the first to fourth memory cell arrays 1200_1 to 1200_4. Below, the code word is used as the same meaning as search data. For example, the code word may be provided from an external processor (refer to FIG. 14). In the exemplification of FIG. 1, the code word is "1110".

The driver 1100 may provide voltages corresponding to the first code "1" to the first data line pair DL[0] and DLB[0]. For example, a voltage corresponding to logic "1" may be provided to the data line DL[0], and a voltage corresponding to logic "0" being complementary data of logic "1" may be provided to the data line DLB[0]. Likewise, the driver 1100 may provide voltages corresponding to the second code "1" to the second data line pairs DL[1] and DLB[1], may provide voltages corresponding to the third code "1" to the third data line pairs DL[2] and DLB[2], and may provide voltages corresponding to the fourth code "0" to the fourth data line pairs DL[3] and DLB[3].

The first memory cell array 1200_1 may include first to fourth memory cells 1210_1 to 1210_4. The second memory cell array 1200_2 may include fifth to eighth memory cells 1220_1 to 1220_4. The third memory cell array 1200_3 may include ninth to twelfth memory cells 1230_1 to 1230_4. The fourth memory cell array 1200_4 may include thirteenth to sixteenth memory cells 1240_1 to 1240_4. Here, the number of memory cells illustrated in FIG. 1 is only one example, and the number of memory cells may be determined according to the sizes of various code words such as 32 bits to 256 bits. Also, the number of data lines may be changed according to the size of a code word.

Each of the first to sixteenth memory cells 1210_1 to 1210_4, 1220_1 to 1220_4, 1230_1 to 1230_4, and 1240_1 to 1240_4 may include a nonvolatile memory cell or a volatile memory cell. For example, each of the first to sixteenth memory cells 1210_1 to 1210_4, 1220_1 to 1220_4, 1230_1 to 1230_4, and 1240_1 to 1240_4 may include a resistive memory element used in a magnetic random access memory (MRAM), a resistive RAM (Re-RAM), etc. However, the inventive concept is not limited thereto.

Each of the first to sixteenth memory cells 1210_1 to 1210_4, 1220_1 to 1220_4, 1230_1 to 1230_4, and 1240_1 to 1240_4 may include one of a logic "1", a logic "0", and a don't care (DC) bit. In the case of searching for data (or cell data) stored in memory cells, a memory cell in which the DC bit is stored outputs a matching result regardless of a code word.

Each of the first, fifth, ninth, and thirteenth memory cells 1210_1, 1220_1, 1230_1, and 1240_1 is provided with the first code "1" of the code word through the first data line pair DL[0] and DLB[0]. Each of the second, sixth, tenth, and fourteenth memory cells 1210_2, 1220_2, 1230_2, and 1240_2 is provided with the second code "1" of the code word through the second data line pair DL[1] and DLB[1]. Each of the third, seventh, eleventh, and fifteenth memory cells 1210_3, 1220_3, 1230_3, and 1240_3 is provided with the third code "1" of the code word through the third data line pair DL[2] and DLB[2]. Each of the fourth, eighth, twelfth, and sixteenth memory cells 1210_4, 1220_4, 1230_4, and 1240_4 is provided with the fourth code "0" of the code word through the fourth data line pair DL[3] and DLB[3].

Each of the first to sixteenth memory cells 1210_1 to 1210_4, 1220_1 to 1220_4, 1230_1 to 1230_4, and 1240_1 to 1240_4 determines whether data stored therein matches with the provided code word, by using an on voltage Von provided from the bias circuit 1500. Matching lines ML0, ML1, ML2, and ML3 are precharged to a power supply voltage VDD before a search (or, a match) operation.

According to one embodiment, the first memory cell array 1200_1 compares data "1X10" stored therein with the code word. Since bits of the stored data "1X10" respectively match with bits of the code word "1110", the first memory cell array 1200_1 does not discharge the matching line ML0. Since data "101X" stored in the second memory cell array 1200_2 does not match with the code word "1110", the second memory cell array 1200_2 discharges the matching line ML1 to a ground voltage GND. Since data "11XX" stored in the third memory cell array 1200_3 match with the code word "1110", the third memory cell array 1200_3 does not discharge the matching line ML2. Since data "1XX1" stored in the fourth memory cell array 1200_4 does not match with the code word "1110", the fourth memory cell array 1200_4 discharges the matching line ML3 to the ground voltage GND.

The first and third match amplifiers 1300_1 and 1300_3 are respectively provided with the power supply voltage VDD from the matching lines ML0 and ML2, may buffer the provided voltages, and may output the buffered voltages to lines MML0 and MML2. Also, the second and fourth match amplifiers 1300_2 and 1300_4 are respectively provided with the ground voltage GND from the matching lines ML1 and ML3, may buffer the provided voltages, and may output the buffered voltages to lines MML1 and MML3.

The priority encoder 1400 outputs an address of a memory cell array having data matched with the code word as a match address ML_add, based on voltages (or signals) provided from the lines MML0 to MML3. For example, if there are one or more memory cell arrays having data matched with the cord word, the priority encoder 1400 may output an address of one memory cell array depending on a priority algorithm.

The priority encoder 1400 may set a priority of memory cell arrays depending on the number of DC bits. For example, the smaller the number of the DC bits, the higher priority of a memory cell array may be set. In this case, in the example of FIG. 1, the first and third memory cell arrays 1200_1 and 1200_3 respectively have data matching with the code word. The number of DC bit of the first memory cell array 1200_1 is one and the number of DC bits of the third memory cell arrays 1200_3 is two. Therefore, the priority encoder 1400 may output an address of the first memory cell array 1200_1 as the match address ML_add, based on an encoded signal. In example embodiments, the priority encoder 1400 may include an internal encoder and a read only memory (ROM). The internal encoder may receive signals of the lines MML0 to MML3 (e.g., "1010") and may provide signals (e.g., "1000") to the ROM by using the previously set priority. The ROM may output an address of the first memory cell array 1200_1 as the match address ML_add based on the provided signals "1000". However, the inventive concept is not limited to the above algorithm.

The bias circuit 1500 generates the on voltage Von by using a dummy memory cell. Here, the dummy memory cell is cell for modeling of a memory cell of first to fourth memory cell arrays 1200_1 to 1200_4. The bias circuit 1500 provides the on voltage Von to the first to fourth memory cell arrays 1200_1 to 1200_4. A configuration and an operation of the bias circuit 1500 will be in detail described with reference to FIGS. 10 and 11.

Figure 2:
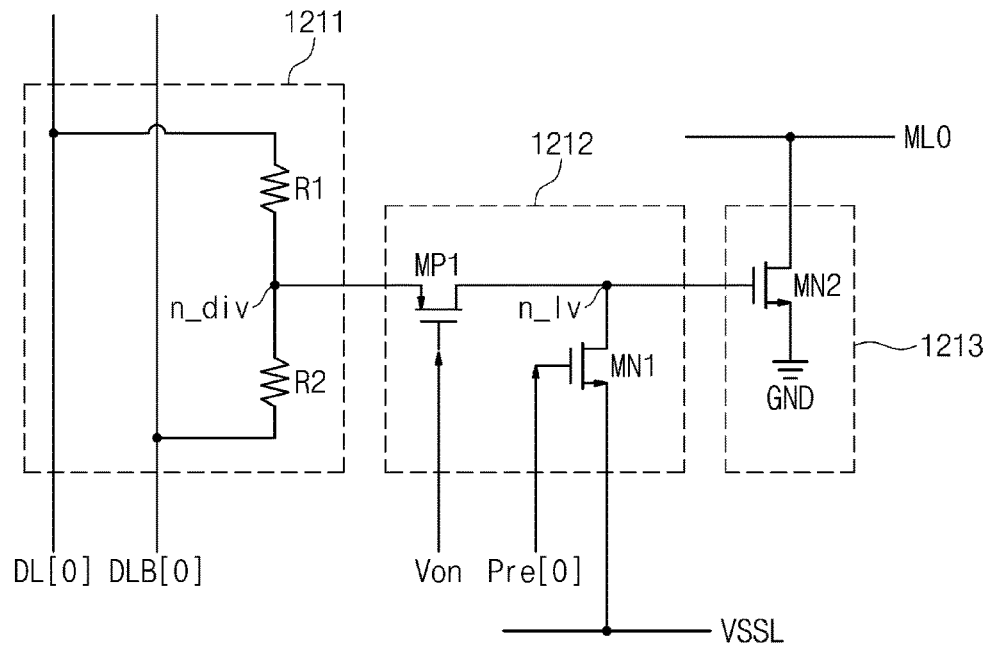
FIG. 2 is a circuit diagram illustrating a first memory cell illustrated in FIG. 1 according to example embodiments.

FIG. 2 is a circuit diagram illustrating a first memory cell illustrated in FIG. 1. FIG. 2 will be described with reference to FIG. 1 according to example embodiments. The first to sixteenth memory cells 1210_1 to 1210_4, 1220_1 to 1220_4, 1230_1 to 1230_4, and 1240_1 to 1240_4 may be configured substantially the same as each other and may operate substantially the same. Accordingly, for convenience of description, the first memory cell 1210_1 will be exemplified to describe a configuration and an operation of a memory cell. The first memory cell 1210_1 may include a data storage circuit 1211, a limiter circuit 1212, and a discharge circuit 1213.

The data storage circuit 1211 may include first and second resistors R1 and R2. The first resistor R1 is connected between the first data line DL[0] and a node n_div. The second resistor R2 is connected between the first complementary data line DLB[0] and the node n_div. Each of the first resistor R1 and the second resistor R2 may be implemented using a resistive memory element used in an MRAM, ReRAM, etc. The resistive memory element refers to an element that stores data on the basis of a resistance value. Each of the first resistor R1 and the second resistor R2 may be programmed to a high resistance state HRS or a low resistance state LRS. A resistance value of the high resistance state has a resistance value (e.g., 3 times, 10 times, or 100 times) higher than a resistance value of the first resistor R1 or the second resistor R2 programmed to the low resistance state.

For example, the case where the first resistor R1 is programmed to the high resistance state and the second resistor R2 is programmed to the low resistance state may be defined as data of logic "1" is stored in the data storage circuit 1211. The case where the first resistor R1 is programmed to the low resistance state and the second resistor R2 is programmed to the high resistance state may be defined as data of logic "0" is stored in the data storage circuit 1211. Also, the case where the first resistor R1 and the second resistor R2 are programmed to the high resistance state may be defined as data of the DC bit is stored in the data storage circuit 1211. However, the inventive concept is not limited thereto.

The first resistor R1 and the second resistor R2 may be programmed to different states depending on the magnitude of a voltage applied in a program operation or a direction of a current applied in the program operation. An operation of programming the first resistor R1 and the second resistor R2 will be described with reference to FIG. 3.

The data storage circuit 1211 is provided with voltages corresponding to a code word through the first data line pair DL[0] and DLB[0]. In the example of FIGS. 1 and 2, a voltage of logic "1" is provided to the first data line DL[0], and a voltage of logic "0" is provided to the first complementary data line DLB[0].

The limiter circuit 1212 may include a first PMOS transistor MP1 and a first NMOS transistor MN1. The first PMOS transistor MP1 is connected between the node n_div and a node n_lv. The first PMOS transistor MP1 may be provided with the on voltage Von through a gate terminal from the bias circuit 1500. The first PMOS transistor may receive a voltage of the node n_div from the data storage circuit 1211. The first PMOS transistor MP1 provides the voltage of the node n_div to the node n_lv based on the on voltage Von. The first NMOS transistor MN1 is connected between the node n_lv and a voltage VSSL. For example, a level of the voltage VSSL may be the ground voltage GND or a negative voltage lower than the ground voltage GND. The first NMOS transistor MN1 discharges a voltage of the node n_lv to the voltage VSSL based on a level of a signal Pre[0].

Referring to FIG. 2, the first PMOS transistor MP1 is exemplified in the limiter circuit 1212. However, an NMOS transistor may be used instead of the first PMOS transistor MP1, or an NMOS transistor and a PMOS transistor may be used together. Likewise, the first NMOS transistor MN1 is exemplified in the limiter circuit 1212. However, a PMOS transistor may be used instead of the first NMOS transistor MN1, or an NMOS transistor and a PMOS transistor may be used together.

The discharge circuit 1213 may include a second NMOS transistor MN2. The second NMOS transistor MN2 is connected between the matching line ML0 and the ground voltage GND. The second NMOS transistor MN2 may discharge the matching line ML0 to the ground voltage GND based on a level of a voltage of the node n_lv. Below, an operation of the first memory cell 1210_1 according to the inventive concept will be described.

Figure 3:
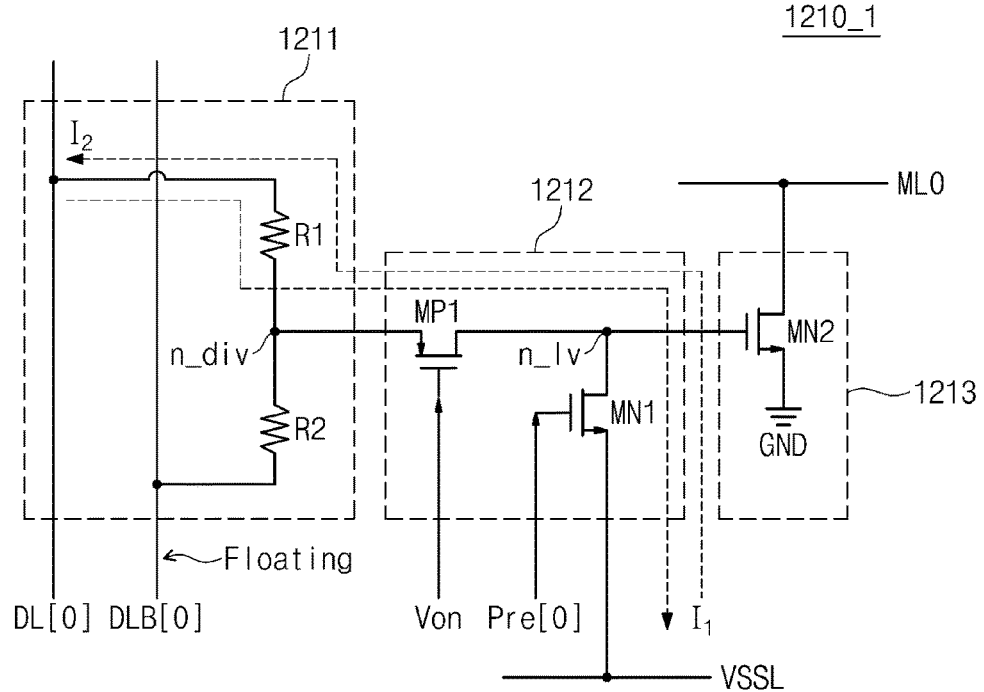
FIG. 3 is a circuit diagram for describing an operation of programming the first memory cell of FIG. 2 according to example embodiments.

FIG. 3 is a circuit diagram for describing an operation of programming a first memory cell 1210_1 of FIG. 2 according to example embodiments. An operation of programming the first resistor R1 is illustrated in FIG. 3. In an embodiment, each of the first resistor R1 and the second resistor R2 may be implemented using an MRAM cell. In a exemplary program operation, the power supply voltage VDD is applied to the first data line DL[0]. The first complementary data line DLB [0] is floated. Then, the on voltage Von having a ground voltage (GND) level is applied to the first PMOS transistor MP1 and the first PMOS transistor MP1 is turned on. A voltage of a logic "1" is applied to a line of the signal Pre[0], and thus, the first NMOS transistor MN1 is turned on. The voltage VSSL may be a voltage that is the same as or lower than the ground voltage GND. However, the inventive concept is not limited thereto.

According to the above voltage condition, a first current $I_1$ flows from the first data line DL[0] to a voltage (VSSL) line through the first resistor R1, the first PMOS transistor MP1, and the first NMOS transistor MN1. The first resistor R1 is programmed by the first current $I_1$. For example, the first resistor R1 may be programmed to a high resistance state (HRS) by the first current $I_1$. The first current $I_1$ is exemplified in FIG. 3.

As another example, the first resistor R1 may be programmed to a low resistance state (LRS). First, a voltage the same as or lower than the ground voltage GND may be applied to the first data line DL[0]. The first complementary data line DLB[0] is floated. Then, the on voltage Von having a ground voltage (GND) level is applied to the first PMOS transistor MP1. Here, a voltage the same as or higher than the power supply voltage VDD may be applied as the voltage VSSL (or may be applied to the voltage (VSSL) line).

According to the above voltage condition, a second current $I_2$ flows from the voltage (VSSL) line to the first data line DL[0] through the first NMOS transistor MN1, the first PMOS transistor MP1, and the first resistor R1. The first resistor R1 may be programmed to a low resistance state by the second current $I_2$.

However, the inventive concept is not limited to the above voltage levels. For example, the first data line pair DL[0] and DLB[0], the on voltage Von, the signal Pre[0], and the voltage VSSL may be set to various voltage levels. Also, for example, the first resistor R1 may be programmed to a low resistance state by the first current $I_1$, and the first resistor R1 may be programmed to a high resistance state by the second current $I_2$.

The second resistor R2 may be programmed by substantially the same method as the first resistor R1. In the case of programming the second resistor R2, the first data line DL[0] is floated. Also, a voltage, the level of which is the same as or higher than that of the power supply voltage VDD may be applied to the first complementary data line DLB[0], and a voltage, the level of which is the same as or lower than that of the ground voltage GND may be applied to the voltage (VSSL) line. Alternatively, a voltage, the level of which is the same as or lower than that of the ground voltage GND may be applied to the first complementary data line DLB[0], and a voltage, the level of which is the same as or higher than that of the power supply voltage VDD may be applied to the voltage (VSSL) line. The second resistor R2 may be programmed by a current that flows based on the above voltage condition.

Figures 4, 5:
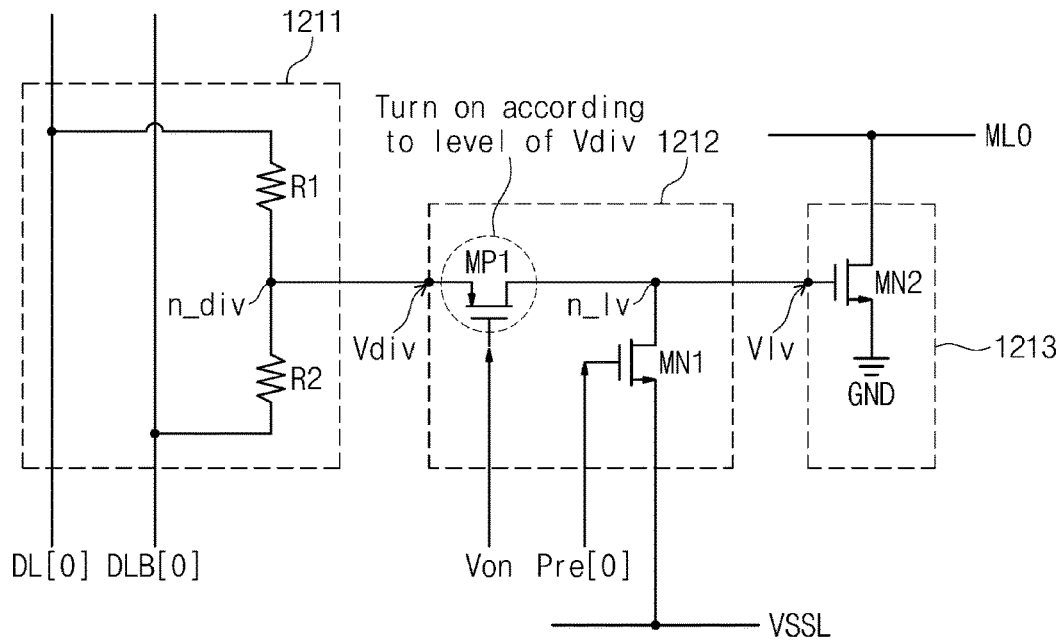
FIGS. 4 and 5 are a circuit diagram and a table for describing an operation of searching for data stored in the first memory cell of FIG. 2 according to example embodiments.

FIGS. 4 and 5 are a circuit diagram and a table for describing an operation of searching for data stored in a first memory cell of FIG. 2 according to example embodiments. Before a data search operation (or, match operation) requested after a previous data search operation, the node n_lv is discharged to the voltage VSSL by the first NMOS transistor MN1, and the matching line ML0 is precharged to the power supply voltage VDD. After the node n_lv is discharged, the first NMOS transistor MN1 is turned off by the signal Pre[0].

To search for data, the first data line pair DL[0] and DLB[0] is biased according to a logical value of a code word. Then, a voltage difference between the first data line DL[0] and the first complementary data line DLB [0] is divided by the first and second resistors R1 and R2, and the divided voltage Vdiv is formed at the node n_div.

In the case where a difference between the voltage Vdiv and the on voltage Von is smaller than a threshold voltage of the first PMOS transistor MP1, the first PMOS transistor MP1 is turned off, and thus, the voltage Vdiv is not transmitted to the node n_lv. For example, when a voltage level of the voltage Vdiv is smaller than a predetermined voltage (e.g., is a voltage smaller than a difference between the voltage Vdiv and the on voltage Von), the voltage Vdiv is not transmitted to the node n_lv. Accordingly, a voltage Vlv is maintained at a level of the voltage VSSL. This means that the second NMOS transistor MN2 is turned off and a precharged voltage (e.g., VDD) of the matching line ML0 is maintained.

In the case where a difference between the voltage Vdiv and the on voltage Von is greater than the threshold voltage of the first PMOS transistor MP1, the first PMOS transistor MP1 is turned on, and thus, the voltage Vdiv is transmitted to the node n_lv. For example, when a voltage level of the voltage Vdiv is greater than a predetermined voltage (e.g., is a voltage greater than a difference between the voltage Vdiv and the on voltage Von), the voltage Vdiv is transmitted to the node n_lv. Since the second NMOS transistor MN2 is turned on by the voltage Vlv of the node n_lv, the precharged voltage (e.g., VDD) of the matching line ML0 is discharged to the ground voltage GND.

Data stored in the data storage circuit 1211 and voltage levels within the first memory cell 1210_1 according to a code word are summarized in the table of FIG. 5. Here, a voltage Vdl_l may be a voltage corresponding to logic "0" provided through the first data line DL[0] and may have a level of the ground voltage GND. Also, a voltage Vdl_h may be a voltage corresponding to logic "1" provided through the first data line DL[0] and may have a level of the power supply voltage VDD. However, the inventive concept is not limited thereto.

Referring to FIG. 5, in the case where a code word (e.g., search data) to be found matches with data stored in the data storage circuit 1211, the matching line ML0 maintains a precharged voltage (e.g., VDD). Alternatively, in the case of a memory cell in which data of the DC bit are stored, the matching line ML0 maintains a precharged voltage regardless of the code word. Also, in the case where the code word mismatches with the stored data, the matching line ML0 is discharged to the ground voltage GND.

For example, in the case where data of logic "0" are stored in the data storage circuit 1211, the first resistor R1 is programmed to a low resistance state, and the second resistor R2 is programmed to a high resistance state. The TCAM device 1000 may search for data of logic "0" based on the code word (or search data). According to the code word of logic "0", the voltage Vdl_l corresponding to logic "0" may be applied to the first data line DL[0], and the voltage Vdl_h corresponding to logic "1" may be applied to the first complementary data line DLB[0]. In this case, the voltage Vdiv divided by the first resistor R1 and the second resistor R2 may be relatively low in level. In the case where a difference between the voltage Vdiv and the on voltage Von is smaller than a threshold voltage |Vthp| of the first PMOS transistor MP1, the first PMOS transistor MP1 is turned off. For example, when a voltage level of the voltage Vdiv is smaller than a predetermined voltage (e.g., is a voltage smaller than a difference between the voltage Vdiv and the on voltage Von), the voltage Vdiv is not transmitted to the node n_lv. Thus, the voltage Vlv maintains the discharged voltage VSSL in level. Accordingly, since the second NMOS transistor MN2 is turned off, the precharged voltage of the matching line ML0 is maintained.

In the above-described case, the TCAM device 1000 may search for data of logic "1" based on the code word. According to the code word of logic "1", the voltage Vdl_h may be applied to the first data line DL[0], and the voltage Vdl_l may be applied to the first complementary data line DLB[0]. In this case, the voltage Vdiv may be relatively high in level. In the case where a difference between the voltage Vdiv and the on voltage Von is greater than the threshold voltage |Vthp| of the first PMOS transistor MP1, the first PMOS transistor MP1 is turned on. For example, when a voltage level of the voltage Vdiv is greater than a predetermined voltage (e.g., a voltage greater than a difference between the voltage Vdiv and the on voltage Von), the voltage Vdiv is transmitted to the node n_lv. Accordingly, the second NMOS transistor MN2 is turned on by the voltage Vlv. The precharged voltage of the matching line ML0 is discharged to the ground voltage GND by the second NMOS transistor MN2.

Below, the voltage Vdiv when the code word matches with stored data is referred to as a "voltage Vdiv_m". Also, the voltage Vdiv when the code word mismatches with stored data is referred to as a "voltage Vdiv_mm". A search operation (or a match operation) when data of logic "1" are stored in the data storage circuit 1211 is substantially the same as the above-described search operation, and a description thereof is thus omitted.

For example, in the case where data of the DC bit is stored in the data storage circuit 1211, the first resistor R1 and the second resistor R2 are respectively programmed to a high resistance state. In this case, the voltage Vlv is "(Vdl_h−Vdl_l)/2" regardless of the code word. Below, the voltage Vlv formed upon searching for data of a memory cell in which data of the DC bit is stored is referred to as a "voltage Vdiv_x". In an embodiment of the inventive concept, the on voltage Von is greater in level than a difference between the maximum value of the voltage Vdiv_x and the threshold voltage magnitude |Vthp| of the first PMOS transistor MP1 or a difference between the maximum value of the voltage Vdiv_m and the threshold voltage magnitude |Vthp| and is smaller in level than a difference between the maximum value of the voltage Vdiv_mm and the threshold voltage magnitude |Vthp| of the first PMOS transistor MP1.

In the case where a difference between the voltage Vdiv_x and the on voltage Von is smaller than the threshold voltage magnitude |Vthp|, the first PMOS transistor MP1 is turned off. Accordingly, the voltage Vlv is maintained at a level of the voltage VSSL. Thus, the second NMOS transistor MN2 is turned off by the voltage Vlv, and then, the precharged voltage of the matching line ML0 is maintained.

In other examples, in the case where data of the DC bit is stored in the data storage circuit 1211, the voltage Vdiv is not transmitted to the node n_lv by the limiter circuit 1212 regardless of the code word. Accordingly, the voltage Vlv is the voltage VSSL, and the matching line ML0 is maintained at the precharged voltage. The sensing margin of the first memory cell 1210_1 may increase depending on the above operation. This will be described with reference to FIGS. 8 and 9.

Figure 6:
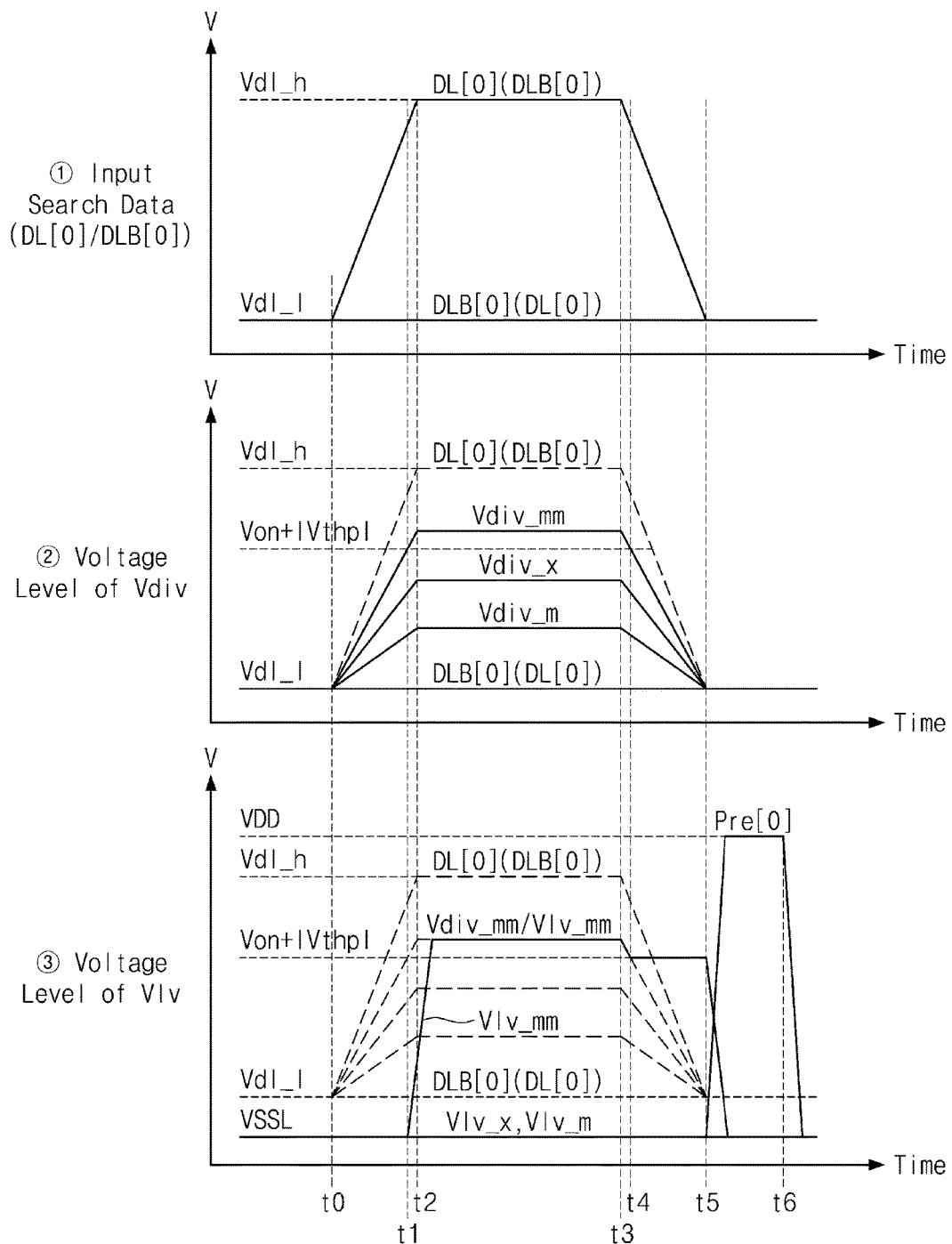
FIG. 6 is timing diagrams for describing changes in voltages during an operation of searching for data stored in the first memory cell of FIG. 2 according to example embodiments.

FIG. 6 is timing diagrams for describing changes in voltages during an operation of searching for data stored in a first memory cell of FIG. 2 according to example embodiments. FIG. 6 will be described with reference to FIGS. 2 to 5. Stages ① to ③ illustrated in FIG. 6 do not mean that a search operation according to an embodiment of the inventive concept is divided in a time series order. Only, a search operation divided into stages ① to ③ for convenience of description is illustrated. Accordingly, the inventive concept is not limited to an order of stages ① to ③.

From t0 to t2, voltages corresponding to a cord word (search data) are respectively applied to the first data line DL[0] and the first complementary data line DLB[0]. From t3 to t5, voltages of the first data line DL[0] and the first complementary data line DLB[0] return to the voltage Vdl_l (stage ①).

A voltage difference of the first data line DL[0] and the first complementary data line DLB[0] is divided by the first and second resistors R1 and R2, and thus, the voltage Vdiv is formed (stage ②). The voltage Vdiv_mm, Vdiv_x, or Vdiv_m divided by the first and second resistors R1 and R2 increases from t0 to t2. Also, the maximum value of the voltage Vdiv_mm, Vdiv_x, or Vdiv_m is maintained from t2 to t3 and decreases to the voltage Vdl_l from t3 to t5.

As illustrated in FIG. 6, the voltage Vdiv_mm is formed to be lower than the voltage Vdl_h. Also, the voltage Vdiv_x is formed to be lower than the voltage Vdiv_mm, and the voltage Vdiv_m is formed to be lower than the voltage Vdiv_x but higher than the voltage Vdl_l. The on voltage Von is provided from the bias circuit 1500 such that a sum "Von+|Vthp|" of the on voltage Von and the threshold voltage magnitude of the first PMOS transistor MP1 is lower than the maximum value of the voltage Vdiv_mm and is higher than the maximum value of the voltage Vdiv_x. Accordingly, from t1 to t4, the first PMOS transistor MP1 may be turned on by the voltage Vdiv_mm but may be turned off by the voltages Vdiv_x and Vdiv_m.

The voltage Vdiv is transmitted to the node n_lv by an operation of the first PMOS transistor MP1, and thus, the voltage Vlv is formed (stage ③). In the case where the stored data in the first memory cell 1210_1 matches with the code word or the DC bit is stored in the first memory cell 1210_1, the voltages Vlv_x and Vlv_m are maintained at a level of the voltage VSSL.

In the case where the stored data in the first memory cell 1210_1 mismatches with the code word, the voltage Vlv_mm starts to increase at t1 when the voltage Vdiv_mm is greater than the voltage "Von+|Vthp|". Then, since the second NMOS transistor MN2 is turned on by the voltage Vlv_mm, the matching line ML0 is discharged. Also, the first PMOS transistor MP1 is turned off at t4 when the voltage Vdiv_mm is smaller than the voltage "Von+|Vthp|". From t4 to t5, the voltage Vlv_mm may be maintained with a level of the voltage "Von+|Vthp|". After the search operation is completed, from t5 to t6, a voltage of logic "1" is applied to a line of the signal Pre[0] to discharge the node n_lv. After t5, the voltage Vlv_mm is discharged to the voltage VSSL by the first NMOS transistor MN1 turned on. After t6, the signal Pre[0] transitions to the voltage VS SL again.

In FIG. 6, the voltage Vdl_h is illustrated as being lower than the power supply voltage VDD. Also, the voltage Vdl_l is illustrated as being higher than the voltage VSSL. However, the voltage levels are only an example, and the inventive concept is not limited thereto.

Figure 7:
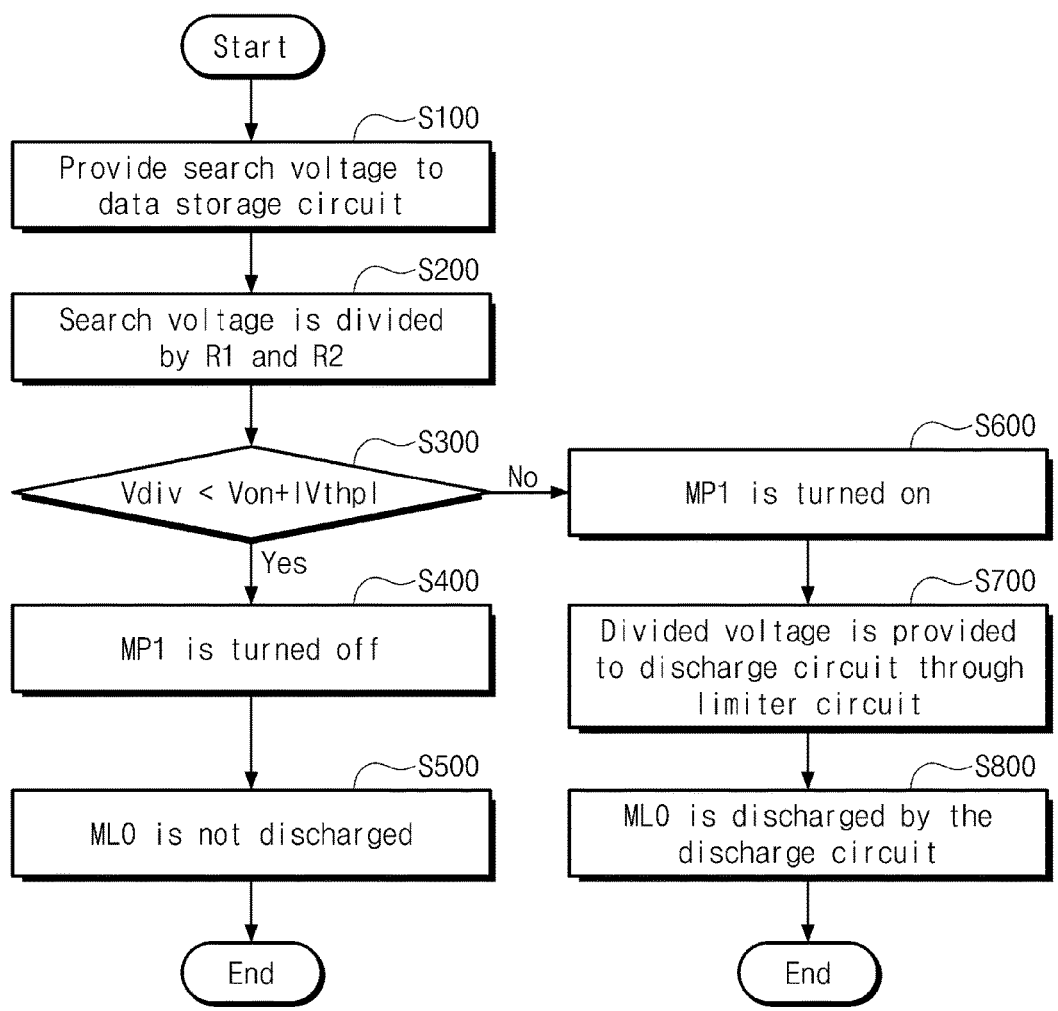
FIG. 7 is a flowchart for describing an operation of the first memory cell of FIG. 2 according to a data search result according to example embodiments.

FIG. 7 is a flowchart for describing an operation of a first memory cell of FIG. 2 according to a data search result according to example embodiments. FIG. 7 will be described with reference to FIGS. 2 to 5. A voltage corresponding to a code word is provided to the data storage circuit 1211 of the first memory cell 1210_1 through the first data line pair DL[0] and DLB[0] (S100). The provided voltage is divided by the first and second resistors R1 and R2 included in the data storage circuit 1211 (S200). As described with reference to FIGS. 2 to 5, a level of the divided voltage Vdiv may vary depending on whether data stored in the first memory cell 1210_1 matches with the code word.

The first PMOS transistor MP1 is turned on or turned off according to the level of the divided voltage Vdiv (S300). If the voltage Vdiv is less than the voltage "Von+|Vthp|" (Yes), the first PMOS transistor MP1 is turned off (S400). In this case, the discharged voltage VSSL is maintained at the node n_lv, and thus, the second NMOS transistor MN2 is turned off. Accordingly, the matching line ML0 is not discharged and maintains a precharged voltage (S500).

If the voltage Vdiv is greater than the voltage "Von+|Vthp|" (No), the first PMOS transistor MP1 is turned on (S600). Accordingly, the voltage Vdiv is transmitted to the node n_lv (S700). Since the voltage Vlv is the voltage Vdiv in level, the second NMOS transistor MN2 is turned on. Accordingly, the matching line ML0 is discharged to the ground voltage GND (S800). After operation S500 or operation S800 is completed, the node n_lv may be discharged to the voltage VSSL, and the matching line ML0 may be precharged to the power supply voltage VDD.

Figure 8:
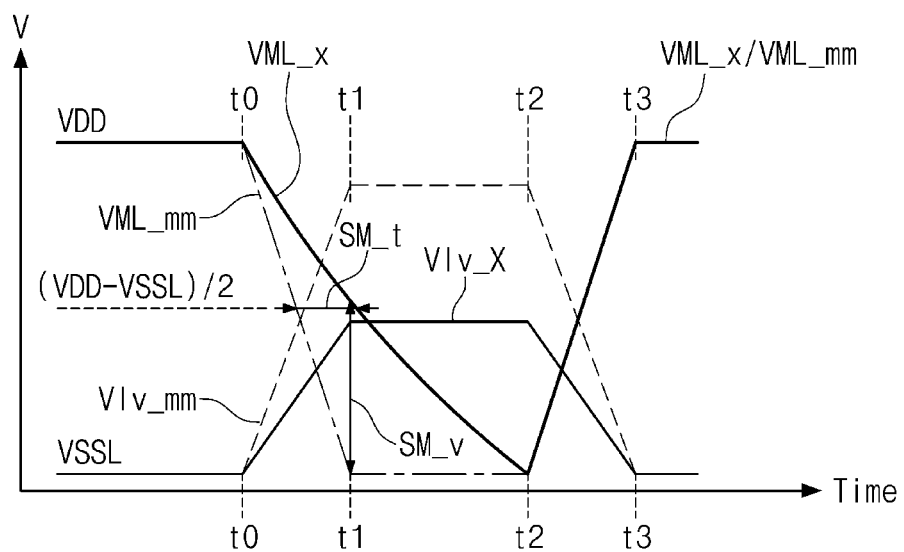
FIGS. 8 and 9 are timing diagrams for describing an advantage of the first memory cell of FIG. 2 according to an embodiment of the inventive concept.
Figure 9:
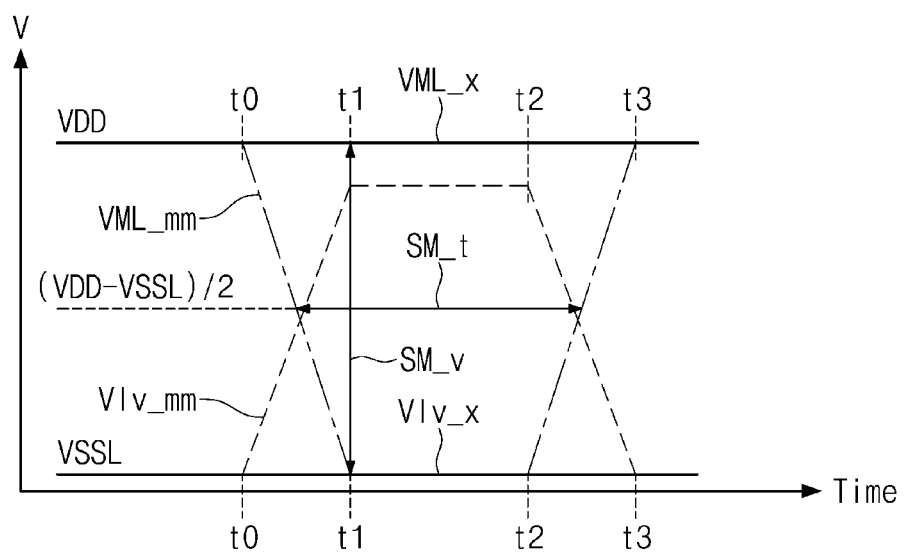

FIGS. 8 and 9 are timing diagrams for describing an advantage of a first memory cell of FIG. 2 according to an embodiment of the inventive concept. The voltage Vlv and a voltage VML of the matching line ML0 are illustrated in FIG. 8 when there is performed a search operation of the first memory cell 1210_1 in which the limiter circuit 1212 according to an embodiment of the inventive concept is not included. In the example of FIG. 8, since the first memory cell 1210_1 does not include the limiter circuit 1212, the node n_div is directly connected to the node n_lv. Accordingly, the voltage Vdiv is the same as the voltage Vlv.

In the case where stored data mismatches with a code word, from t0 to t1, the voltage Vlv_mm increases by a provided search voltage. A voltage VML_mm of the matching line ML0 is discharged to the ground voltage GND by the voltage Vlv_mm. In the example of FIGS. 8 and 9, for convenience of description, it is assumed that a level of the ground voltage GND is the same as that of the voltage VSSL. From t1 to t2, the voltage Vlv_mm maintains the maximum voltage, and the voltage VML_mm transitions to the voltage VSSL. From t2 to t3, the voltage Vlv_mm decreases to the voltage VSSL. From t2 to t3, the voltage VML_mm may increase to the power supply voltage VDD by a precharge operation.

In the case where the DC bit is stored in the data storage circuit 1211, from t0 to t1, the voltage Vlv_x may increase by a provided search voltage. From t1 to t2, the voltage Vlv_x maintains the maximum voltage. Since the maximum value of the voltage Vlv_x is less than the maximum value of the voltage Vlv_mm, from t0 to t2, the voltage VML_x of the matching line ML0 may be discharged with a relatively slow speed. From t2 to t3, the voltage Vlv_x decreases to the voltage VSSL. From t2 to t3, the voltage VML_x may increase to the power supply voltage VDD by the precharge operation.

The voltage Vlv and the voltage VML of the matching line ML0 are illustrated in FIG. 9 when there is performed a search operation of the first memory cell 1210_1 in which the limiter circuit 1212 according to an embodiment of the inventive concept is included.

In the case where stored data mismatches with a code word, from t0 to t1, the voltage Vdiv_mm increases by a provided search voltage. The first PMOS transistor MP1 of the limiter circuit 1212 is turned on by the voltage Vdiv_mm, and thus, the voltage Vdiv_mm is transmitted to the node n_lv. Accordingly, the voltage Vlv_mm is set to the voltage Vdiv_mm. Afterwards, waveforms of the voltage Vlv_mm and the voltage VML_mm are the same as illustrated in FIG. 8.

In the case where the DC bit is stored in the data storage circuit 1211, from t0 to t1, the voltage Vdiv_x increases by a provided search voltage. The first PMOS transistor MP1 of the limiter circuit 1212 is turned off by the voltage Vdiv_x. Accordingly, from t0 to t3, the voltage Vlv_x is maintained at a level of the voltage VSSL, and thus, the second NMOS transistor MN2 is turned off. As a result, the matching line ML0 is not discharged and maintains a level of the power supply voltage VDD.

Sensing margins for the voltages Vlv_mm and Vlv_x are illustrated in the timing diagrams of FIGS. 8 and 9. The sensing margins include a time-axis margin and a voltage-axis margin capable of distinguishing the voltage Vlv_mm when mismatching and the voltage Vlv_x when matching. The time margin SM_t is illustrated with respect to a voltage of "(VDD−VSSL)/2", and the voltage margin SM_v is illustrated with respect to t1.

In FIG. 9, since the voltage VML_x is maintained with the power supply voltage VDD, the time margin SM_t is the same as a width of a time-axis direction of the voltage VML_mm at "(VDD−VSSL)/2". Also, since the voltage VML_mm decreases to the voltage VSSL or the voltage GND, the voltage margin SM_v is "VDD−VSSL" or "VDD−GND" at t1. In contrast, in FIG. 8, the voltage VML_x decreases with a relatively slow speed, not maintained with the power supply voltage VDD. Compared with the case of FIG. 9, the time margin SM_t and the voltage margin SM_v decrease by the discharged voltage VML_x. As a result, the sensing margin of the voltage VML increases by the limiter circuit 1212.

Figure 10:
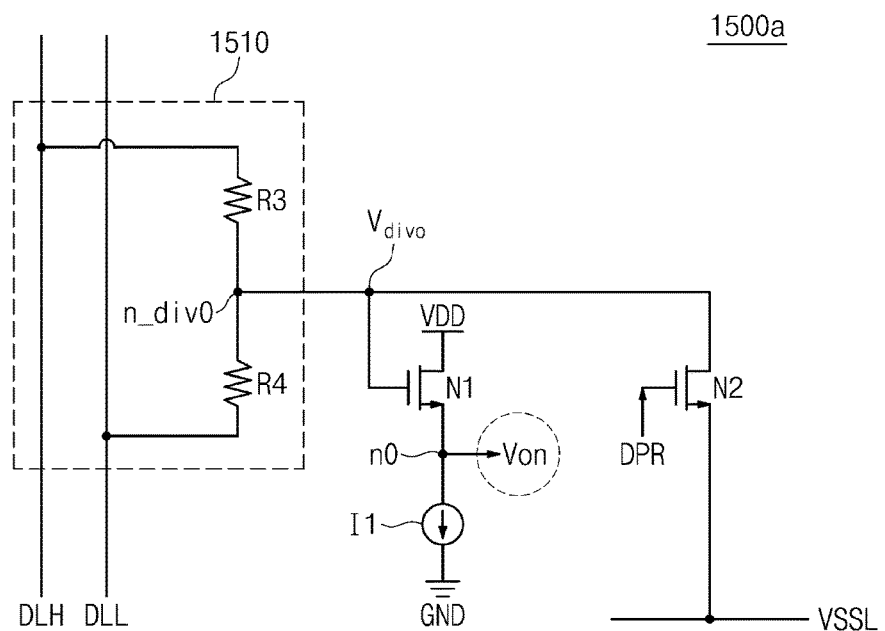
FIGS. 10 and 11 are circuit diagrams illustrating embodiments of a bias circuit illustrated in FIG. 1 according to example embodiments.
Figure 11:
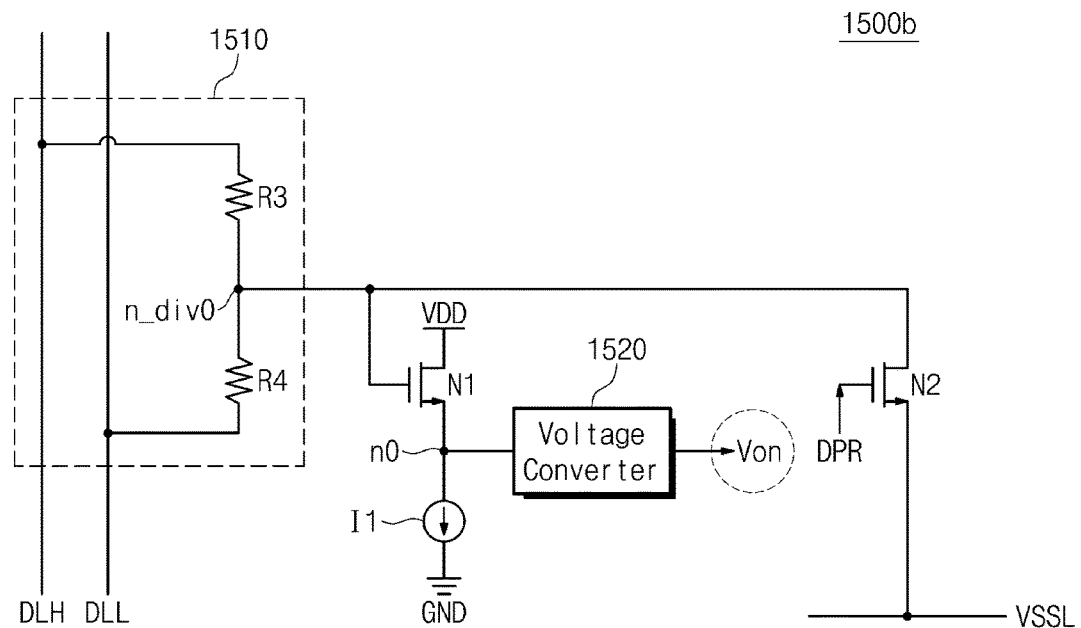

FIGS. 10 and 11 are circuit diagrams illustrating embodiments of a bias circuit illustrated in FIG. 1 according to example embodiments. A bias circuit 1500a of FIG. 10 may include a voltage determination circuit 1510, first and second NMOS transistors N1 and N2, and a current source I1.

The voltage determination circuit 1510 may include a third resistor R3 and a fourth resistor R4. The third resistor R3 and the fourth resistor R4 are configured to be the same as the first resistor R1 or the second resistor R2, respectively. In the bias circuit 1500a, the third resistor R3 may be programmed to a low resistance state, and the fourth resistor R4 may be programmed to a high resistance state. The third resistor R3 is connected between a first dummy line DLH and a node n_div0, and the fourth resistor R4 is connected between a second dummy line DLL and the node n_div0.

The first NMOS transistor N1 is connected between the power supply voltage VDD and a node n0. A gate of the first NMOS transistor N1 is connected to the node n_div0. The current source I1 is connected between the node n0 and the ground voltage GND. A voltage of the node n0 is output as the on voltage Von. The second NMOS transistor N2 is connected between the node n_div0 and the voltage VSSL. The second NMOS transistor N2 is turned on or off according to a signal DPR.

The bias circuit 1500a operates differently depending on a program operation and a search operation of the TCAM device 1000. In the case where the TCAM device 1000 programs the first memory cell 1210_1, an operation of the bias circuit 1500a is as follows. First, the ground voltage GND (or the voltage VSSL) is applied to the first and second dummy lines DLH and DLL, respectively. Here, it is assumed that a level of the ground voltage GND is the same as that of the voltage VSSL. Also, a voltage of logic "1" is applied to a line of a signal DPR. A voltage of the node n_div0 is the ground voltage GND. Since the ground voltage GND is applied to a gate of the first NMOS transistor N1, the first NMOS transistor N1 is turned off. A voltage of the node n0 is discharged by the current source I1, and the on voltage Von is the ground voltage GND. Since the ground voltage GND is provided to the first memory cell 1210_1 as the on voltage Von, the first PMOS transistor MP1 of the first memory cell 1210_1 is turned on. The first resistor R1 or the second resistor R2 is programmed by a current flowing through the first PMOS transistor MP1.

In the case where the TCAM device 1000 performs an operation of searching for the first memory cell 1210_1, an operation of the bias circuit 1500a is as follows. First, the second NMOS transistor N2 is turned off by the signal DPR of logic "0". The power supply voltage VDD (or the voltage Vdl_h) is applied to the first dummy line DLH. The ground voltage GND (or the voltage VSSL) is applied to the second dummy line DLL. A voltage difference between the first and second dummy lines DLH and DLL is divided by the third and fourth resistors R3 and R4. Referring to the table of FIG. 5, a voltage of the node n_div0 (Vdiv0) is the same as the maximum voltage Vdiv_mm illustrated in FIG. 6.

The first NMOS transistor N1 and the current source I1 constitute a source follower. The voltage Vdiv_mm is shifted by the source follower. In detail, the on voltage Von is "Vdiv_mm−(|Vthn|+Vg_od)". Here, "Vthn" is a threshold voltage of the first NMOS transistor N1, and "Vg_od" is an overdrive voltage used for the first NMOS transistor N1 to drive a current of the current source I1.

In general, a value of "Vthn" or "Vthp" may vary depending on a process, voltage, and temperature (PVT) variation. Also, with regard to the first to fourth resistors R1 to R4, a resistance value of a high resistance state or a low resistance state, a ratio of a resistance value of a high resistance state and a resistance value of a low resistance state, etc. may vary depending on the PVT variation.

For example, in the case where "|Vthn|" is the same as "|Vthp|", the on voltage Von is "Vdiv_mm−(|Vthp|+Vg_od)". In the case where stored data mismatches with search data, a difference between the voltage Vdiv_mm and the on voltage Von, which is a source-gate voltage of the first PMOS transistor MP1, is "|Vthp|+Vg_od". Accordingly, since the source-gate voltage "|Vthp|+Vg_od" always is greater than "|Vthp|" regardless of the PVT variation, the first PMOS transistor MP1 is turned on. That is, a turn-on condition of the first PMOS transistor MP1 is not affected by the PVT variation.

Alternatively, in the case where "|Vthn|" follows similar tendency with "|Vthp|", a difference between the voltage Vdiv_mm and the on voltage Von follows a value of "|Vthp|+Vg_od" with a given difference. The influence of the turn-on condition of the first PMOS transistor MP1 by the PVT variation is reduced. As a result, during the search operation, the limiter circuit 1212 of the first memory cell 1210_1 has a robust characteristic against the PVT variation.

A bias circuit 1500b of FIG. 11 may include the voltage determination circuit 1510, a voltage converter 1520, the first and second NMOS transistors N1 and N2, and the current source I1. A configuration and an operation of the bias circuit 1500b of FIG. 11 are substantially the same as those of the bias circuit 1500a of FIG. 10.

The voltage converter 1520 corrects a difference between "|Vthn|" and "|Vthp|". For example, the voltage converter 1520 converts the on voltage Von of "Vdiv_mm−(|Vthn|+Vg_od)" to the on voltage Von of "Vdiv_mm−(|Vthp|+Vg_od)". For example, the voltage converter 1520 may include any circuit for implementing the above-described function. Compared with FIG. 10, the limiter circuit 1212 provided with the on voltage Von from the bias circuit 1500b of FIG. 11 may have a strengthened robust characteristic against the PVT variation.

In an embodiment, the first and second NMOS transistors N1 and N2 are exemplified in FIGS. 10 and 11. However, instead of the first and second NMOS transistors N1 and N2, PMOS transistors may be used or NMOS transistors and PMOS transistors may be used together.

Figure 12:
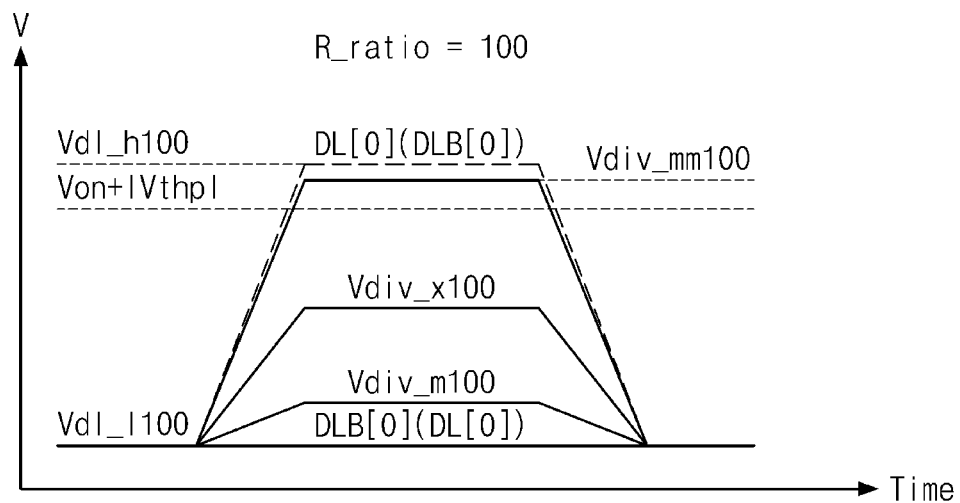
FIGS. 12 and 13 are timing diagrams for describing an advantage of the first memory cell of FIG. 2 using a bias voltage according to an embodiment of the inventive concept.
Figure 13:
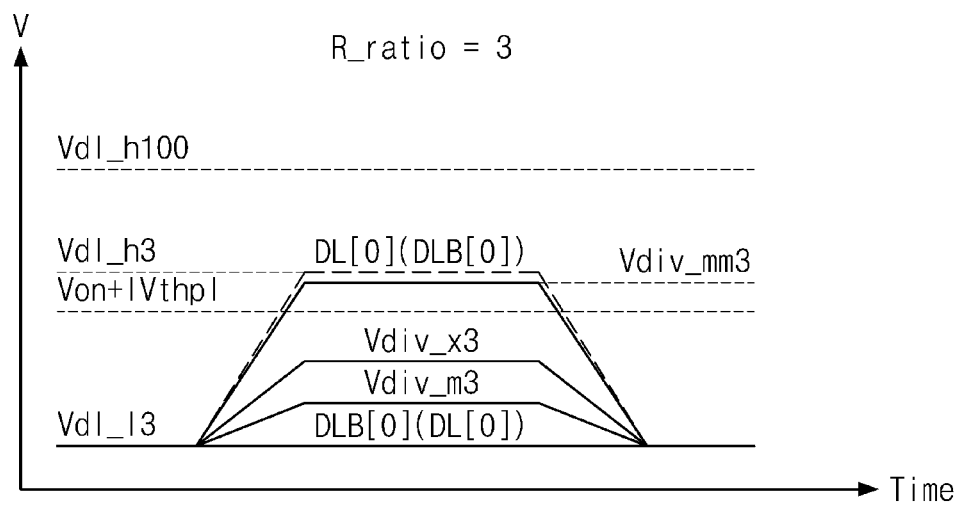

FIGS. 12 and 13 are timing diagrams for describing an advantage of a first memory cell of FIG. 2 using a bias voltage according to an embodiment of the inventive concept. FIGS. 12 and 13 will be described with reference to FIGS. 3 and 5. In FIGS. 12 and 13, a resistance ratio R_ratio means a ratio of a resistance value of a high resistance state and a resistance value of a low resistance state. The voltage Vdiv of the node n_div is determined by values of the first and second resistors R1 and R2. Accordingly, in the case where the resistance ratio R_ratio decreases, differences between the voltage Vdiv_mm when mismatching, the voltage Vdiv_x when the DC bit is stored, and the voltage Vdiv_m when matching decrease. Accordingly, a voltage margin for distinguishing the voltages Vdiv_mm, Vdiv_x, and Vdiv_m may decrease.

Voltages within the first memory cell 1210_1 when the resistance ratio R_ratio is "100" are illustrated FIG. 12. Also, voltages within the first memory cell 1210_1 when the resistance ratio R_ratio is "3" are illustrated FIG. 13. Voltages Vdl_h3, Vdiv_mm3, Vdiv_x3, and Vdiv_m3 illustrated in FIG. 13 are formed to be less than respective voltages Vdl_h100, Vdiv_mm100, Vdiv_x100, and Vdiv_m100 illustrated in FIG. 12. That is, a voltage between the voltage Vdiv_mm3 and the voltage Vdiv_x3 is less than a voltage between the voltage Vdiv_mm100 and the voltage Vdiv_x100. Accordingly, a voltage margin for distinguishing the voltages Vdiv_mm and Vdiv_x is reduced.

In an embodiment of the inventive concept, in the case where "|Vthn|" is the same as "|Vthp|", the on voltage Von is "Vdiv_mm−(Vthp|+Vg_od)". In the example of FIG. 12, a difference between the voltages Vdiv_mm100 and "Von+|Vthp|", which is needed to turn on the first PMOS transistor MP1 is "Vg_od". Likewise, in the case of FIG. 13, a difference between the voltages Vdiv_mm3 and "Von+|Vthp|", which is needed to turn on the first PMOS transistor MP1 is "Vg_od". That is, the difference between the voltages Vdiv_mm3 and "Von+|Vthp|" is uniformly maintained regardless of the resistance ratio R_ratio. As a result, the voltage margin for distinguishing the voltage Vdiv_mm and the voltage Vdiv_x may be maintained by the bias circuit 1500a or 1500b of the inventive concept.

Figure 14:
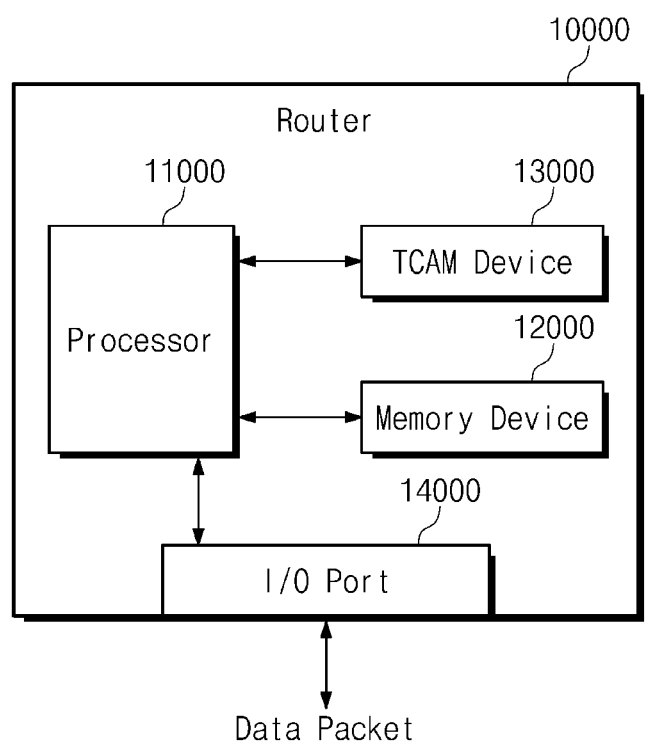
FIG. 14 is a block diagram illustrating a router including the TCAM device according to an embodiment of the inventive concept.

FIG. 14 is a block diagram illustrating a router including a TCAM device according to an embodiment of the inventive concept. Referring to FIG. 14, a router 10000 may include a processor 11000, a memory device 12000, a TCAM device 13000, and an input/output port 14000.

The router 10000 is an Internet networking device for connection between networks (e.g., a local area network (LAN) and a wide area network (WAN)). The router 10000 may exchange data packets with a communication device (e.g., a router or a computing device).

The processor 11000 may process a data packet provided through the input/output port 14000. The memory device 12000 and the TCAM device 13000 may store pieces of information needed for the processor 11000 to process data packets.

The TCAM device 13000 may store an IP address. The processor 11000 may search an IP address matched with information included in the received data packet from the TCAM device 13000. The processor 11000 may record the found IP address in the data packet and may transmit the recorded result to the corresponding port. For example, the TCAM device 13000 may include the TCAM device 1000 described with reference to FIGS. 1 to 7 and FIGS. 9-13.

A memory cell of a TCAM device of the inventive concept includes a limiter circuit. Also, a bias circuit of the inventive concept provides an on voltage to the limiter circuit. The above configuration may make it possible to improve a sensing margin of the TCAM for distinguishing voltages in a memory cell according to stored data. Also, a robust characteristic against a PVT variation may be improved, and a sufficient voltage margin may be maintained even at a low resistance ratio of a resistive memory element.

While the inventive concept has been described with reference to embodiments, it will be apparent to those skilled in the art that various changes and modifications may be made without departing from the spirit and scope of the following claims. Therefore, it should be understood that the above embodiments are not limiting, but illustrative.

What is claimed is:

1. A ternary content addressable memory (TCAM) device comprising:
  a plurality of memory cells, each of the plurality of memory cells comprising:

a data storage circuit comprising a first resistor and a second resistor connected in series to divide a search voltage corresponding to search data, and configured to store cell data;
a limiter circuit configured to receive the divided voltage through an input terminal and transmit an output voltage through an output terminal based on a level of the divided voltage; and
a discharge circuit configured to discharge a matching line indicating whether the stored cell data matches with the search data, based on the output voltage of the limiter circuit.

2. The TCAM device of claim 1, wherein the stored cell data is based on each of the first resistor and the second resistor being programmed to a high resistance state (HRS) or a low resistance state (LRS).

3. The TCAM device of claim 2, wherein each of the first resistor and the second resistor is programmed to the HRS or the LRS based on a voltage or a current applied to each of the first resistor and the second resistor.

4. The TCAM device of claim 2, wherein, if the cell data stored in the data storage circuit corresponds to a don't care bit, each of the first resistor and the second resistor is programmed to the HRS.

5. The TCAM device of claim 1, wherein the limiter circuit comprises a first transistor which is provided with an on voltage from a bias circuit outside each of the plurality of memory cells through a gate terminal of the first transistor and the first transistor is configured to turn on or turn off according to a difference between the divided voltage and the on voltage to transmit the divided voltage.

6. The TCAM device of claim 5, wherein the first transistor is turned on when the stored cell data mismatches with the search data.

7. The TCAM device of claim 5, wherein the limiter circuit further comprises a second transistor configured to discharge the output voltage of the limiter circuit.

8. The TCAM device of claim 1, wherein the discharge circuit comprises a transistor configured to discharge the matching line based on the output voltage of the limiter circuit, when the stored cell data mismatches with the search data.

9. The TCAM device of claim 1, wherein the limiter circuit is configured such that the output voltage of the limiter circuit is discharged to a ground voltage after a search operation, for searching for a memory cell in which data matching with the search data is stored, is completed.

10. The TCAM device of claim 1, wherein the matching line is precharged to a power supply voltage after a search operation is completed.

11. A ternary content addressable memory (TCAM) device comprising:
a driver configured to provide a search voltage corresponding to search data to a data line;
a memory cell comprising a first resistor and a second resistor for storing cell data, wherein the search voltage provided through the data line is divided by the first resistor and the second resistor and wherein the memory cell determines whether the search data matches with the stored cell data, based on the divided voltage;
a matching line discharged according to whether the search data matches with the stored cell data; and
a bias circuit configured to provide the memory cell with an on voltage used to determine whether the search data matches with the stored cell data,
wherein the bias circuit comprises:
a voltage determination circuit comprising a third resistor and a fourth resistor connected in series to divide a voltage provided through a dummy data line pair; and
a source follower configured to generate the on voltage based on a voltage divided by the third resistor and the fourth resistor.

12. The TCAM device of claim 11, wherein the memory cell comprises:
a limiter circuit configured to receive the divided voltage through an input terminal and to transmit the divided voltage provided to the input terminal to an output terminal depending on a difference between the on voltage and the divided voltage; and
a discharge circuit configured to discharge a voltage of the matching line depending on a level of a voltage of the output terminal of the limiter circuit.

13. The TCAM device of claim 11, wherein a voltage corresponding to logical high of the cell data is applied to one data line of the dummy data line pair, and a voltage corresponding to logical low of the cell data is applied to the other data line of the dummy data line pair.

14. The TCAM device of claim 11, wherein the third resistor is configured to be programmed to a high resistance state, and the fourth resistor is configured to be programmed to a low resistance state.

15. The TCAM device of claim 11, wherein when the stored cell data mismatches with the search data, a level of the voltage divided by the third resistor and the fourth resistor is the same as a level of the voltage divided by the first resistor and the second resistor.

16. A method for a search operation of a ternary content addressable memory (TCAM) including a memory cell, the method comprising:
providing a search voltage corresponding to search data to the memory cell;
dividing the search voltage, by a first resistor and a second resistor connected in series in the memory cell;
transmitting the divided voltage to an input terminal of a discharge circuit in the memory cell based on a level of the divided voltage, by a limiter circuit in the memory cell;
discharging a matching line based on the divided voltage, by the discharge circuit; and
discharging the transmitted voltage by the limiter circuit after the search operation is completed.

17. The method of claim 16, wherein the discharging of the transmitted voltage comprises:
discharging the transmitted voltage to a ground voltage and precharging the matching line with a power supply voltage.

18. The method of claim 16, wherein transmitting the divided voltage to the discharge circuit comprises transmitting the divided voltage to the discharge circuit when the divided voltage is greater than a predetermined voltage.

19. The TCAM device of claim 1, wherein the limiter circuit discharges the output voltage of the limiter circuit to a voltage level equal to or lower than a ground voltage.

20. The TCAM device of claim 12, wherein the limiter circuit discharges the transmitted voltage of the output terminal to a voltage level equal to or lower than a ground voltage after a search operation, for searching for a memory cell in which data matching with the search data is stored, is completed.

* * * * *